US010269433B2

(12) United States Patent
Okajima (10) Patent No.: US 10,269,433 B2
(45) Date of Patent: Apr. 23, 2019

(54) MEMORY DEVICE

(71) Applicant: TOSHIBA MEMORY CORPORATION, Minato-ku, Tokyo (JP)

(72) Inventor: Mutsumi Okajima, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/926,190

(22) Filed: Mar. 20, 2018

(65) Prior Publication Data

US 2019/0088334 A1 Mar. 21, 2019

(30) Foreign Application Priority Data

Sep. 19, 2017 (JP) .................................. 2017-178984

(51) Int. Cl.
*G11C 13/00* (2006.01)
*G11C 16/08* (2006.01)

(52) U.S. Cl.
CPC .......... *G11C 16/08* (2013.01); *G11C 13/0026* (2013.01); *G11C 13/0028* (2013.01); *G11C 2211/4016* (2013.01); *G11C 2213/82* (2013.01)

(58) Field of Classification Search
CPC .. G11C 16/08; G11C 13/0026; G11C 13/0028
USPC ........................................................ 365/177
See application file for complete search history.

(56) References Cited

U.S. PATENT DOCUMENTS

| 7,910,914 | B2 * | 3/2011 | Tanaka .................. G11C 5/025 257/5 |
| 8,179,707 | B2 | 5/2012 | Song et al. |
| 8,530,955 | B2 | 9/2013 | Iino et al. |
| 9,224,788 | B2 | 12/2015 | Kobayashi et al. |
| 9,406,721 | B1 | 8/2016 | Yamamoto et al. |
| 9,530,824 | B2 * | 12/2016 | Takaki ................ H01L 27/249 |
| 9,553,101 | B2 | 1/2017 | Kim et al. |
| 9,673,304 | B1 | 6/2017 | Sano et al. |

(Continued)

OTHER PUBLICATIONS

Hong-Yu Chen, et al., "HfOx Based Vertical Resistive Random Access Memory for Cost-Effective 3D Cross-Point Architecture without Cell Selector", IEDM12-497-500 IEEE 2012.

(Continued)

*Primary Examiner* — Xiaochun L Chen
(74) *Attorney, Agent, or Firm* — Foley & Lardner LLP (57) ABSTRACT

A memory device according to an embodiment includes word lines stacked in a third direction perpendicular to a first direction and a second direction; main bit lines including a first main bit line and extending in the second direction; transistors including first and second transistors of which the channel width is greater than the width of the main bit lines; sub-bit lines extending in the third direction and including a first sub-bit line electrically connected to the first main bit line, with the first transistor interposed therebetween, and a second sub-bit line electrically connected to the first main bit line, with the second transistor interposed therebetween, and being adjacent to the first sub-bit line, a line segment virtually connecting the first sub-bit line and the second sub-bit line intersecting the second direction; and a resistance-change layer provided between the word lines and the sub-bit lines.

15 Claims, 7 Drawing Sheets

(56) References Cited

U.S. PATENT DOCUMENTS

| | | | |
|---|---|---|---|
| 9,721,961 B2* | 8/2017 | Okajima | H01L 27/2481 |
| 2008/0175031 A1 | 7/2008 | Park et al. | |
| 2008/0175032 A1* | 7/2008 | Tanaka | G11C 5/025 |
| | | | 365/51 |
| 2010/0258779 A1 | 10/2010 | Mikawa et al. | |
| 2011/0068409 A1 | 3/2011 | Kim et al. | |
| 2011/0122676 A1 | 5/2011 | Murooka et al. | |
| 2011/0242872 A1 | 10/2011 | Hanzawa | |
| 2014/0369104 A1 | 12/2014 | Murooka | |
| 2016/0141334 A1* | 5/2016 | Takaki | H01L 27/249 |
| | | | 257/5 |
| 2016/0322369 A1 | 11/2016 | Shibata et al. | |
| 2016/0351628 A1* | 12/2016 | Okajima | H01L 27/2481 |

OTHER PUBLICATIONS

I.G. Baek, et al., "Realization of Vertical Resistive Memory (VRRAM) using cost effective 3D Process", IEDM11-737-740 IEEE 2011.
W. C. Chien, et al., "Multi-layer Sidewall $WO_x$ Resistive Memory Suitable for 3D ReRAM", 2012 Symposium on VLSI Technology Digest of Technical Papers, pp. 153-154.
Leqi Zhang, et al., "Analysis of Vertical Cross-Point Resistive Memory (VRRAM) for 3D RRAM Design", IMW IEEE 2013.

* cited by examiner

MEMORY DEVICE

CROSS-REFERENCE TO RELATED APPLICATION

This application is based upon and claims the benefit of priority from Japanese Patent Application No. 2017-178984, filed on Sep. 19, 2017, the entire contents of which are incorporated herein by reference.

FIELD

Embodiments described herein relate generally to memory devices.

BACKGROUND

In a resistance-change memory, a resistance-change layer of a memory cell is changed between a high-resistance state and a low-resistance state by the application of a voltage. For example, when the high-resistance state is defined as data "0" and the low-resistance state is defined as data "1", the memory cell can store 1-bit data of "0" or "1". In some cases, a three-dimensional structure in which the memory cells are three-dimensionally arranged is formed in order to improve the degree of integration of the resistance-change memory. The degree of integration of the resistance-change memory with the three-dimensional structure is expected to be further improved.

DETAILED DESCRIPTION

A memory device according to an embodiment includes: a first word line group including a plurality of word lines, the plurality of word lines having a flat plate shape parallel to a first direction and a second direction perpendicular to the first direction, the plurality of word lines being stacked in a third direction perpendicular to the first direction and the second direction; a plurality of main bit lines including a first main bit line, the plurality of main bit lines extending in the second direction; a plurality of transistors including a first transistor and a second transistor, a channel width of the first transistor and the second transistor in the first direction being greater than a width of the plurality of main bit lines in the first direction, at least some of the plurality of transistors being provided between the plurality of word lines of the first word line group and the plurality of main bit lines; a first sub-bit line group including a plurality of sub-bit lines, the plurality of sub-bit lines of the first sub-bit line group including a first sub-bit line and a second sub-bit line adjacent to the first sub-bit line, the first sub-bit line being electrically connected to the first main bit line with the first transistor interposed therebetween, the second sub-bit line being electrically connected to the first main bit line with the second transistor interposed therebetween, a line segment virtually connecting the first sub-bit line and the second sub-bit line intersecting the second direction, the plurality of sub-bit lines of the first sub-bit line group extending in the third direction, the plurality of sub-bit lines of the first sub-bit line group intersecting the plurality of word lines of the first word line group, each of the plurality of sub-bit lines of the first sub-bit line group being electrically connected to one of the plurality of main bit lines with one of the plurality of transistors interposed therebetween; and a resistance-change layer provided between each of the plurality of word lines of the first word line group and each of the plurality of sub-bit lines of the first sub-bit line group.

Hereinafter, embodiments of the invention will be described with reference to the drawings. In the following description, the same or similar members are denoted by the same reference numerals and the description of the member which has been described once will not be repeated.

In the specification, for convenience of explanation, in some cases, the term "upper part" or "lower part" is used. The term "upper part" or "lower part" just indicates a relative positional relationship in the drawings and does not define a positional relationship with respect to gravity.

The chemical composition of members forming the memory device in the specification can be qualitatively and quantitatively analyzed by, for example, secondary ion mass spectroscopy (SIMS) and energy dispersive X-ray spectroscopy (EDX). In addition, for example, the thickness of the members forming the semiconductor device and the distance between the members can be measured by, for example, a transmission electron microscope (TEM).

Hereinafter, memory devices according to embodiments will be described with reference to the accompanying drawings.

First Embodiment

A memory device according to a first embodiment includes: a first word line group including a plurality of word lines, the plurality of word lines having a flat plate shape parallel to a first direction and a second direction perpendicular to the first direction, the plurality of word lines being stacked in a third direction perpendicular to the first direction and the second direction; a plurality of main bit lines including a first main bit line, the plurality of main bit lines extending in the second direction; a plurality of transistors including a first transistor and a second transistor, a channel width of the first transistor and the second transistor in the first direction being greater than a width of the plurality of main bit lines in the first direction, at least some of the plurality of transistors being provided between the plurality of word lines of the first word line group and the plurality of main bit lines; a first sub-bit line group including a plurality of sub-bit lines, the plurality of sub-bit lines of the first sub-bit line group including a first sub-bit line and a second sub-bit line adjacent to the first sub-bit line, the first sub-bit line being electrically connected to the first main bit line with the first transistor interposed therebetween, the second sub-bit line being electrically connected to the first main bit line with the second transistor interposed therebetween, a line segment virtually connecting the first sub-bit line and the second sub-bit line intersecting the second direction, the plurality of sub-bit lines of the first sub-bit line group extending in the third direction, the plurality of sub-bit lines of the first sub-bit line group intersecting the plurality of word lines of the first word line group, each of the plurality of sub-bit lines of the first sub-bit line group being electrically connected to one of the plurality of main bit lines with one of the plurality of transistors interposed therebetween; and a resistance-change layer provided between each of the plurality of word lines of the first word line group and each of the plurality of sub-bit lines of the first sub-bit line group.

Figure 1:
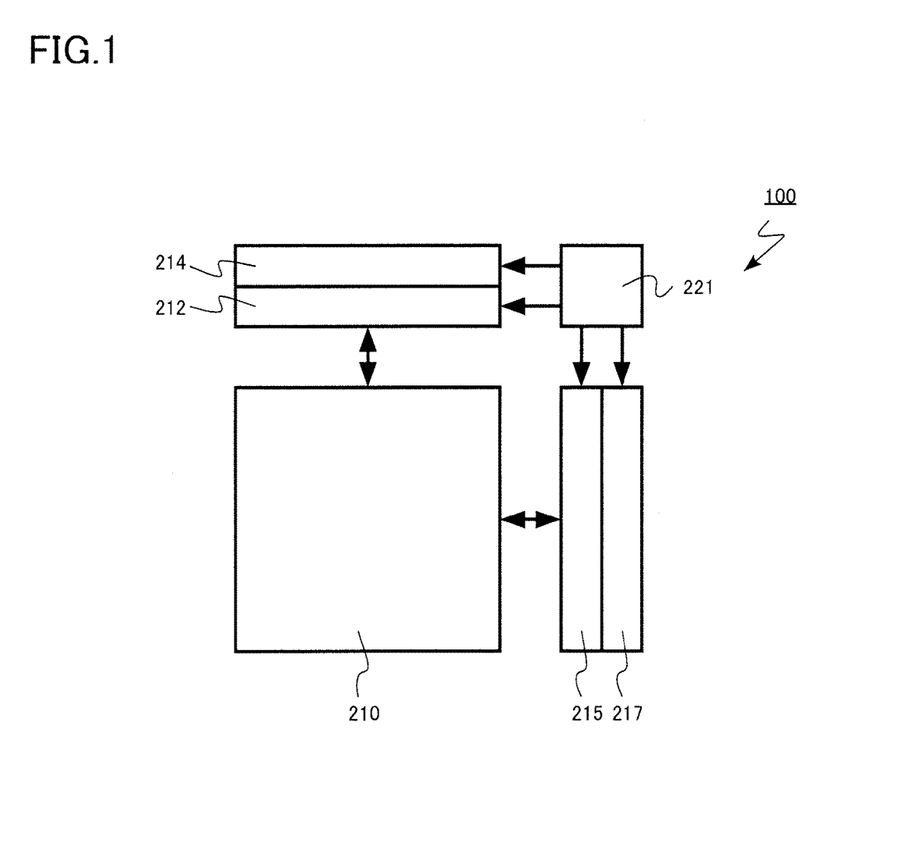
FIG. 1 is a block diagram illustrating a memory device according to a first embodiment.
Figure 2:
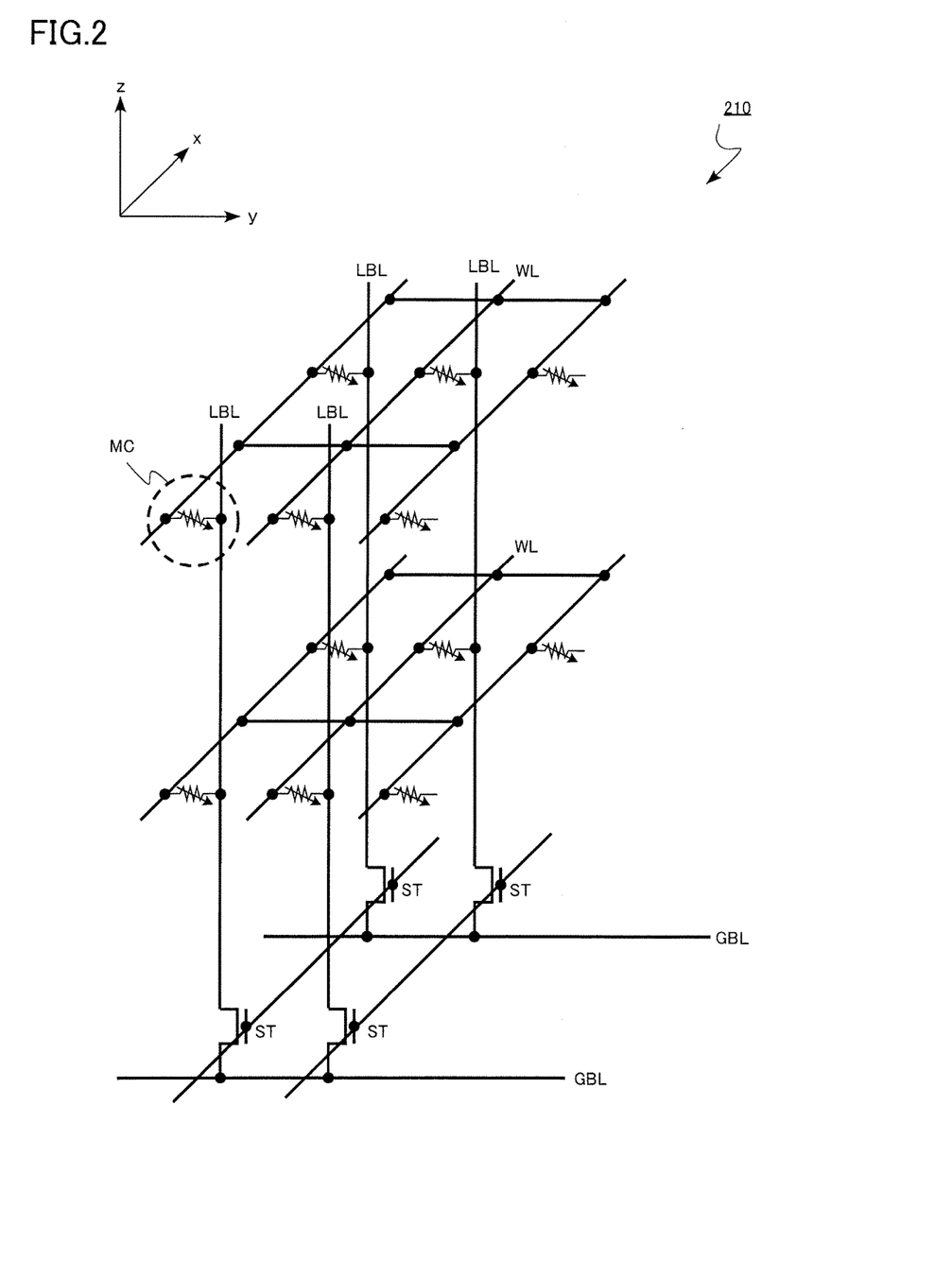
FIG. 2 is an equivalent circuit diagram illustrating a memory cell array according to the first embodiment.

FIG. 1 is a block diagram illustrating the memory device according to the first embodiment. FIG. 2 is an equivalent circuit diagram illustrating a memory cell array of the memory device according to the first embodiment. The memory cell array according to the first embodiment has a three-dimensional structure in which memory cells MC are three-dimensionally arranged. The memory device according to the first embodiment is a resistance-change memory 100. The memory cell MC is a two-terminal resistance-change element. In FIG. 2, a region surrounded by a dotted line corresponds to one memory cell MC.

As illustrated in FIG. 1, the resistance-change memory 100 includes a memory cell array 210, a word line driver circuit 212, a row decoder circuit 214, a sense amplifier circuit 215, a column decoder circuit 217, and a control circuit 221.

As illustrated in FIG. 2, a plurality of memory cells MC are three-dimensionally arranged in the memory cell array 210. The memory cell array 210 includes, for example, a plurality of word lines WL and a plurality of local bit lines LBL (sub-bit lines).

The plurality of word lines WL are provided in the plane that is parallel to the x direction (first direction) and the y direction (second direction) perpendicular to the x direction. The plurality of word lines WL are stacked in the z direction (third direction) perpendicular to the x direction and the y direction.

The plurality of local bit lines LBL extend in the z direction (third direction). The word lines WL and the local bit lines LBL vertically intersect with each other. The memory cell MC is disposed at the intersection between the word line WL and the local bit line LBL.

The plurality of word lines WL are electrically connected to the row decoder circuit 214. The plurality of local bit lines LBL are electrically connected to the sense amplifier circuit 215. Select transistors ST and global bit lines GBL (main bit lines) are provided between the plurality of local bit lines LBL and the sense amplifier circuit 215. A desired local bit line LBL is selected by the select transistor ST. Data of the selected local bit line LBL is transmitted to the sense amplifier circuit 215 through the global bit line GEL.

The row decoder circuit 214 has a function of selecting a word line WL according to an input row address signal. The word line driver circuit 212 has a function of applying a predetermined voltage to the word line WL selected by the row decoder circuit 214.

The column decoder circuit 217 has a function of selecting a local bit line LBL according to an input column address signal. The sense amplifier circuit 215 has a function of applying a predetermined voltage to the local bit line LBL selected by the column decoder circuit 217. In addition, the sense amplifier circuit 215 has a function of detecting a current that flows between the selected word line WL and the selected local bit line LEL and amplifying the detected current.

The control circuit 221 has a function of controlling the word line driver circuit 212, the row decoder circuit 214, the sense amplifier circuit 215, the column decoder circuit 217, and other circuits (not illustrated).

The circuits, such as the word line driver circuit 212, the row decoder circuit 214, the sense amplifier circuit 215, the column decoder circuit 217, and the control circuit 221, are formed by, for example, transistors or wiring layers using a semiconductor layer (not illustrated).

For example, the circuits, such as the word line driver circuit 212, the row decoder circuit 214, the sense amplifier circuit 215, the column decoder circuit 217, and the control circuit 221, are provided in the periphery of the memory cell array 210. For example, the circuits, such as the word line driver circuit 212, the row decoder circuit 214, the sense amplifier circuit 215, the column decoder circuit 217, and the control circuit 221, may be provided above or below the memory cell array 210.

Figure 3:
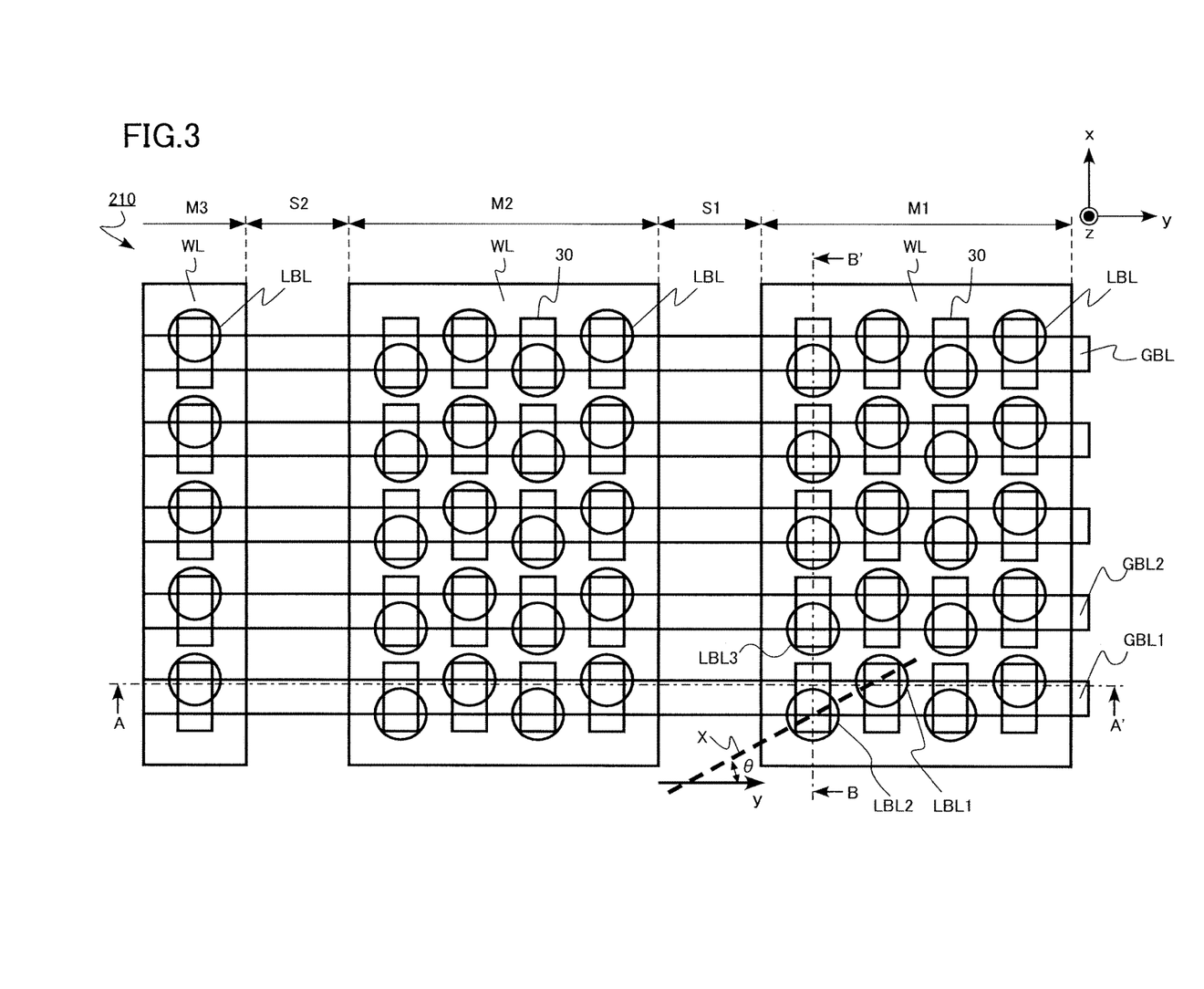
FIG. 3 is a top view schematically illustrating the memory cell array of the memory device according to the first embodiment.
Figure 4:
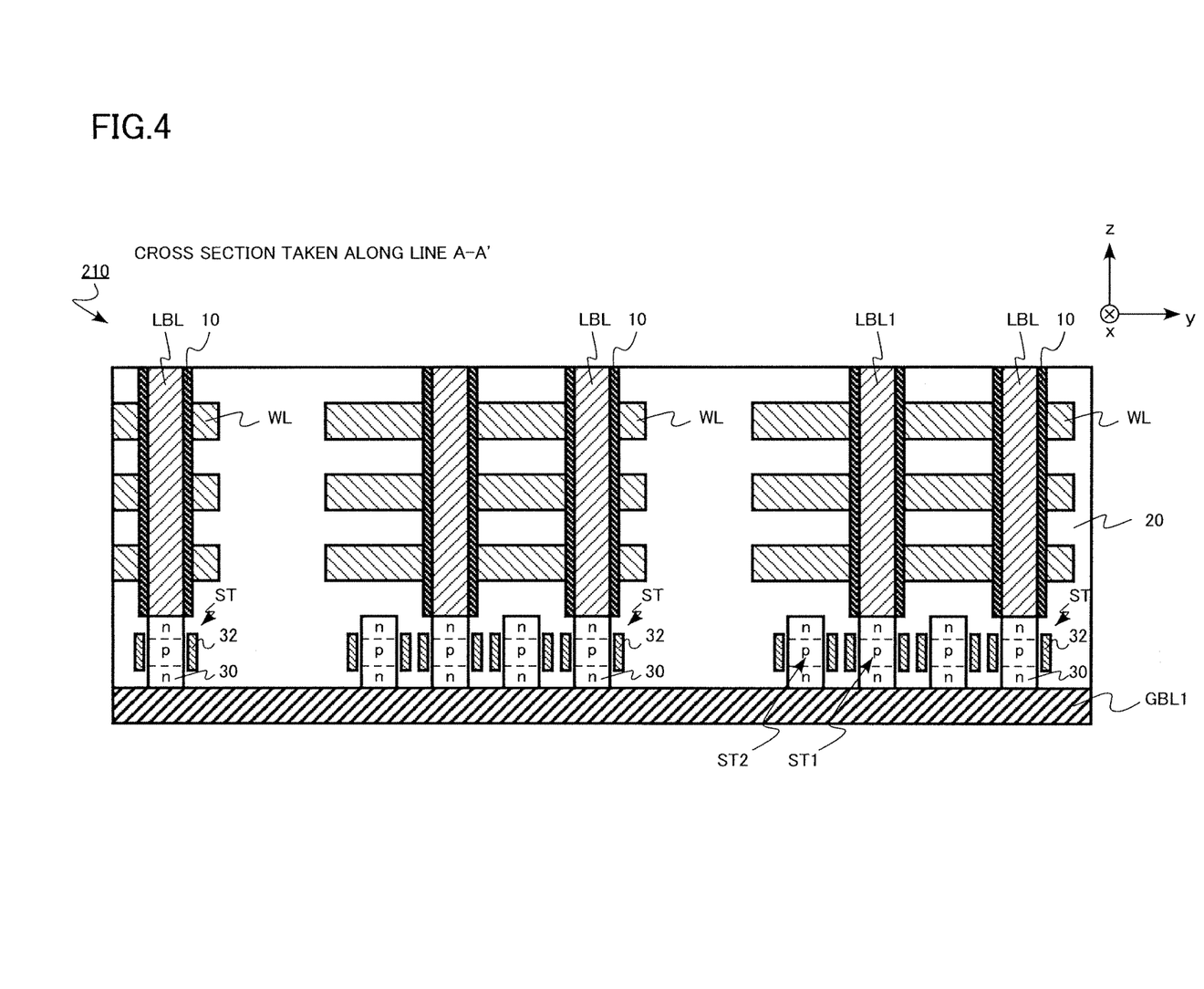
FIG. 4 is a cross-sectional view schematically illustrating the memory cell array of the memory device according to the first embodiment.
Figure 5:
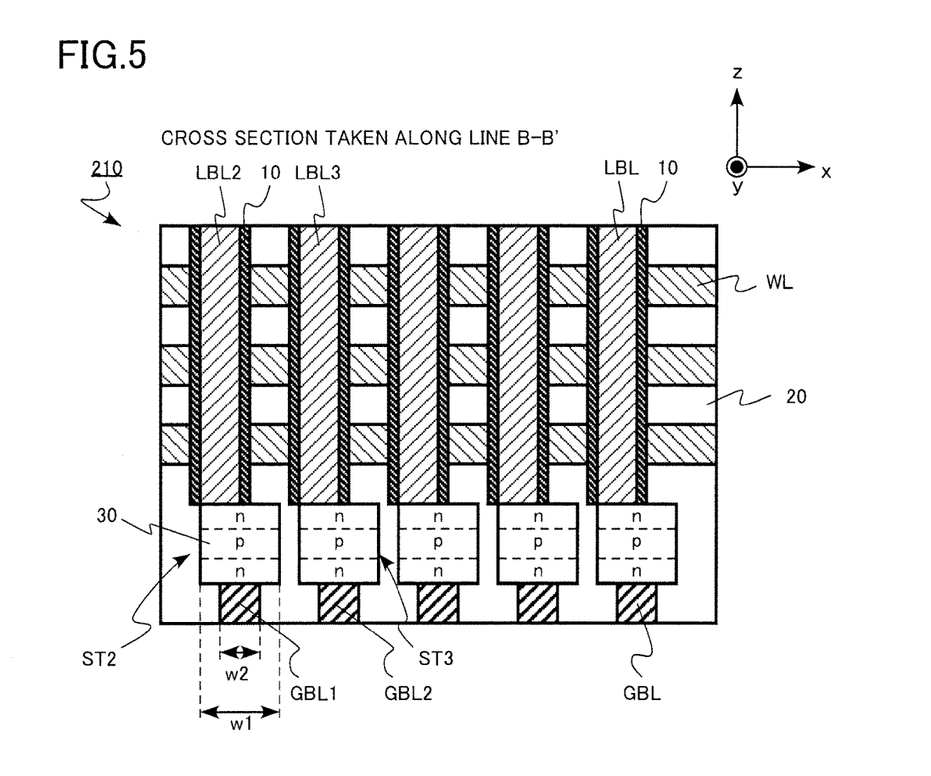
FIG. 5 is a cross-sectional view schematically illustrating the memory cell array of the memory device according to the first embodiment.

FIG. 3 is a top view schematically illustrating the memory cell array 210 of the memory device according to the first embodiment. FIG. 4 is a cross-sectional view schematically illustrating the memory cell array 210 of the memory device according to the first embodiment. FIG. 4 corresponds to the cross section taken along the line A-A' of FIG. 3. FIG. 5 is a cross-sectional view schematically illustrating the memory cell array 210 of the memory device according to the first embodiment. FIG. 5 corresponds to the cross section taken along the line B-B' of FIG. 3.

The memory cell array 210 includes a plurality of word lines WL, a plurality of global bit lines GBL (main bit lines), a plurality of local bit lines LBL (sub-bit lines), a plurality of select transistors ST (transistors), a resistance-change layer 10, and an interlayer insulating layer 20. The select transistor ST includes a semiconductor layer 30, a gate electrode 32, and a gate insulating film (not illustrated). The memory cell array 210 includes a first memory region M1, a second memory region M2, a third memory region M3, a first space region S1, and a second space region S2.

Hereinafter, a plurality of word lines WL in the first memory region M1 are generically referred to as a first word line group and a plurality of local bit lines LBL in the first memory region M1 are generically referred to as a first local bit line group (first sub-bit line group). In addition, a plurality of word lines WL in the second memory region M2 are generically referred to as a second word line group and a plurality of local bit lines LBL in the second memory region M2 are generically referred to as a second local bit line group (second sub-bit line group).

FIG. 3 illustrates the arrangement of the semiconductor layers 30 of a plurality of word lines WL, a plurality of global bit lines GBL (main bit lines), a plurality of local bit lines LBL (sub-bit lines), and a plurality of select transistors ST (transistors) in the memory cell array 210.

The word line WL has a flat plate shape that is parallel to the x direction and the y direction. The word lines WL are stacked in the z direction. The stacked word lines WL are insulated from each other by the interlayer insulating layer 20 and adjacent word lines WL are insulated from each other by the interlayer insulating layer 20. The interlayer insulating layer 20 is made of, for example, silicon oxide.

The plurality of word lines WL are classified into the first word line group in the first memory region M1 and the second word line group in the second memory region M2 in order to easily manufacture the word lines WL and to appropriately adjust the resistance of the word lines WL. The second word line group is separated from the first word line group in the y direction.

The word line WL is made of a conductive material. The word line WL is made of, for example, metal. The word line WL is made of, for example, titanium nitride (TiN) or tungsten (W).

The local bit line LBL extends in the z direction. The local bit line LBL intersects the word line WL. The local bit line LBL is perpendicular to the word line WL. The plurality of local bit lines LBL in the first memory region M1 form the first local bit line group. In addition, the plurality of local bit lines LBL in the second memory region M2 form the second local bit line group.

The local bit line LBL is made of a conductive material. The local bit line LBL is made of, for example, metal. The local bit line LBL is made of, for example, titanium nitride (TiN) or tungsten (W).

The global bit line GBL extends in the y direction. The global bit line GEL is made of a conductive material. The global bit line GBL is made of, for example, metal. The global bit line GBL is made of, for example, titanium nitride (TiN) or tungsten (W).

For example, the width of the global bit line GBL in the x direction is less than the distance between the global bit lines GBL.

The select transistors ST are arranged in an array in the x direction and the y direction. The select transistor ST includes the semiconductor layer 30, the gate electrode 32, and the gate insulating film (not illustrated). The semiconductor layer 30 is made of a semiconductor. The semiconductor layer 30 is made of, for example, polysilicon. The semiconductor layer 30 includes, for example, an n-type source region, a p-type channel region, and an n-type drain region. The select transistor ST is, for example, an n-channel field effect transistor.

One end of the semiconductor layer 30 is electrically connected to the global bit line GBL and the other end of the semiconductor layer 30 is electrically connected to the local bit line LBL. For example, the n-type source region is connected to the global bit line GEL and the n-type drain region is connected to the local bit line LBL.

At least some of the plurality of select transistors ST are provided between a plurality of word lines WL and a plurality of global bit lines GBL in the first word line group. Similarly, at least some of the plurality of select transistors ST are provided between a plurality of word lines WL and a plurality of global bit lines GEL in the second word line group.

Each of the plurality of local bit lines LBL forming the first local bit line group is connected to one of the plurality of global bit lines GBL. One of the plurality of select transistors ST is interposed between each of the plurality of local bit lines LBL and any one of the plurality of global bit lines GBL.

Similarly, each of the plurality of local bit lines LBL forming the second local bit line group is connected to one of the plurality of global bit lines GBL. One of the plurality of select transistors ST is interposed between each of the plurality of local bit lines LBL and one of the plurality of global bit lines GBL.

The resistance-change layer 10 is provided between each of the plurality of word lines WL forming the first word line group and each of the plurality of local bit lines LBL forming the first local bit line group. Similarly, the resistance-change layer 10 is provided between each of the plurality of word lines WL forming the second word line group and each of the plurality of local bit lines LBL forming the second local bit line group.

The resistance-change layer 10 is changed between a high-resistance state and a low-resistance state by the application of a voltage. For example, when the high-resistance state is defined as data "0" and the low-resistance state is defined as data "1", the memory cell can store 1-bit data of "0" or "1".

The material forming the resistance-change layer 10 is not particularly limited as long as it can achieve the function. The resistance-change layer 10 is, for example, a single-layer metal oxide film, a stacked film of a plurality of different metal oxide films, or a stacked film of a semiconductor film and a metal oxide film.

The plurality of global bit lines GBL include a first global bit line GBL1 (first main bit line) and a second global bit line GBL2. The second global bit line GBL2 is adjacent to the first global bit line GBL1 in the x direction (first direction). The plurality of local bit lines LBL forming the first local bit line group include a first local bit line LBL1 (first sub-bit line), a second local bit line LBL2 (second sub-bit line), and a third local bit line LBL3 (third sub-bit line). The plurality of select transistors ST include a first select transistor ST1 (first transistor), a second select transistor ST2 (second transistor), and a third select transistor ST3 (third transistor). The second local bit line LBL2 (second sub-bit line) is adjacent to the first local bit line LBL1 (first sub-bit line). The second local bit line LBL2 and the third local bit line LBL3 are adjacent to each other in the x direction (first direction). The first local bit line LBL1 is disposed between the second local bit line LBL2 and the third local bit line LBL3 in the x direction (first direction) and is disposed at a position different from the position of the second local bit line LBL2 and the third local bit line LBL3 in the y direction (second direction).

The first local bit line LBL1 is electrically connected to the first global bit line GBL1. The first select transistor ST1 is interposed between the first local bit line LBL1 and the first global bit line GBL1. The second local bit line LBL2 is electrically connected to the first global bit line GBL1. The second select transistor ST2 is interposed between the second local bit line LBL2 and the first global bit line GBL1. The third local bit line LBL3 is electrically connected to the second global bit line GBL2. The third select transistor ST3 is interposed between the third local bit line LBL3 and the second global bit line GBL2.

A line segment (a dotted line X in FIG. 3) that virtually connects the first local bit line LBL1 and the second local bit line LBL2 intersects the y direction. In other words, the line segment is inclined with respect to the first global bit line GBL1 that extends in the y direction. The angle (θ in FIG. 3) formed between the line segment and the y direction is, for example, equal to or greater than 15 degrees.

The line segment that virtually connects the first local bit line LBL1 and the second local bit line LBL2 means a line segment that connects a central portion of the first local bit line LBL1 and a central portion of the second local bit line LBL2. The "a central portion of the first local bit line LBL1 and a central portion of the second local bit line LBL2" is strictly defined as the position of the geometric center of gravity of each of the first local bit line LBL1 and the second local bit line LBL2 in the xy plane.

A plurality of local bit lines LBL connected to one global bit line GBL are not arranged in a line, but are arranged in zigzag. As the angle (θ in FIG. 3) between the line segment and the y direction increases, a degree of the zigzag line in the arrangement of the plurality of local bit lines LBL increases. That is, the first local bit line LBL1 is disposed at a position that is closer to the second global bit line LBL2 than the second local bit line LBL2.

The channel width (w1 in FIG. 5) of the first select transistor ST1 and the second select transistor ST2 in the x direction is larger than the width (w2 in FIG. 5) of the first global bit line GBL1 in the x direction. For example, the channel width (w1 in FIG. 5) of the first select transistor ST1 and the second select transistor ST2 in the x direction is equal to or greater than 1.2 times the width (w2 in FIG. 5) of the first global bit line GBL1 in the x direction.

Next, the function and effect of the memory device according to the first embodiment will be described.

A three-dimensional structure in which the memory cells MC are three-dimensionally arranged is formed in order to increase the degree of integration of the resistance-change memory. Since the memory cells MC are three-dimensionally arranged, the degree of integration is expected to be further improved.

In the resistance-change memory 100 according to the first embodiment, a plurality of local bit lines LBL connected to one global bit line GBL are arranged in zigzag. A margin for the short circuit between adjacent local bit lines LBL can be more than that when a plurality of local bit lines LBL are arranged in a line by the above-mentioned arrangement. Therefore, it is possible to reduce the arrangement pitch between the local bit lines LBL in the y direction and to improve the degree of integration of the resistance-change memory.

It is preferable that the degree of the zigzag line be greater than a certain value in order to improve the degree of integration of the resistance-change memory 100. From this point of view, the angle (θ in FIG. 3) between the y direction and the line segment (the dotted line X in FIG. 3) virtually connecting the first local bit line LBL1 and the second local bit line LBL2 is preferably equal to or greater than 15 degrees and more preferably equal to or greater than 30 degrees.

When the gap between adjacent global bit lines GBL is small, the parasitic capacitance between the global bit lines GBL increases. As a result, for example, there is a concern that an operating speed of the memory cell MC, such as a reading speed or a writing speed, will be reduced. In addition, it is preferable to increase the on current of the select transistor ST in order to increase the operating speed.

In the resistance-change memory according to the first embodiment, the channel width (w1 in FIG. 5) of the first select transistor ST1 and the second select transistor ST2 in the x direction is greater than the width (w2 in FIG. 5) of the first global bit line GBL1 in the x direction. That is, the channel width of the select transistor ST in the x direction is greater than the width of the global bit line GBL in the x direction. This configuration makes it possible to increase the amount of on current of the select transistor ST while preventing an increase in the parasitic capacitance between the global bit lines GBL. Therefore, it is possible to improve the operating speed of the resistance-change memory 100.

An increase in the channel width of the select transistor ST in the x direction makes it possible to increase the contact area between the local bit line LBL and the semiconductor layer 30 of the select transistor ST. An increase in the contact area makes it possible to increase the amount of on current of the select transistor ST.

In addition, the increase in the channel width of the select transistor ST in the x direction makes it easy to connect the local bit line LBL and the semiconductor layer 30 of the select transistor ST even when the local bit lines LBL are arranged in zigzag.

The channel width (w1 in FIG. 5) of the first select transistor ST1 and the second select transistor ST2 in the x direction is preferably equal to or greater than 1.2 times the width (w2 in FIG. 5) of the first global bit line GBL1 in the x direction and more preferably equal to or greater than 1.5 times the width in order to increase the amount of on current of the select transistor ST while preventing an increase in the parasitic capacitance between the global bit lines GBL.

It is preferable that the width of the global bit line GBL in the x direction be less than the distance between the global bit lines GBL in order to prevent an increase in the parasitic capacitance between the global bit lines GBL.

As described above, according to the memory device of the first embodiment, it is possible to improve the degree of integration of the resistance-change memory. In addition, it is possible to increase the operating speed of the resistance-change memory.

Second Embodiment

A memory device according to a second embodiment differs from the memory device according to the first embodiment in that the plurality of transistors include a first transistor group, a second transistor group, a third transistor group located between the first transistor group and the second transistor group, a plurality of transistors included in the third transistor group are not connected to the plurality of sub-bit lines of the first sub-bit line group and the plurality of sub-bit lines of the second sub-bit line group, a plurality of transistors included in the first transistor group, the second transistor group, and the third transistor group have the same arrangement pitch in the first direction, and the plurality of transistors included in the first transistor group, the second transistor group, and the third transistor group have the same arrangement pitch in the second direction. Hereinafter, the description of some of the same components as those in the first embodiment will not be repeated.

Figure 6:
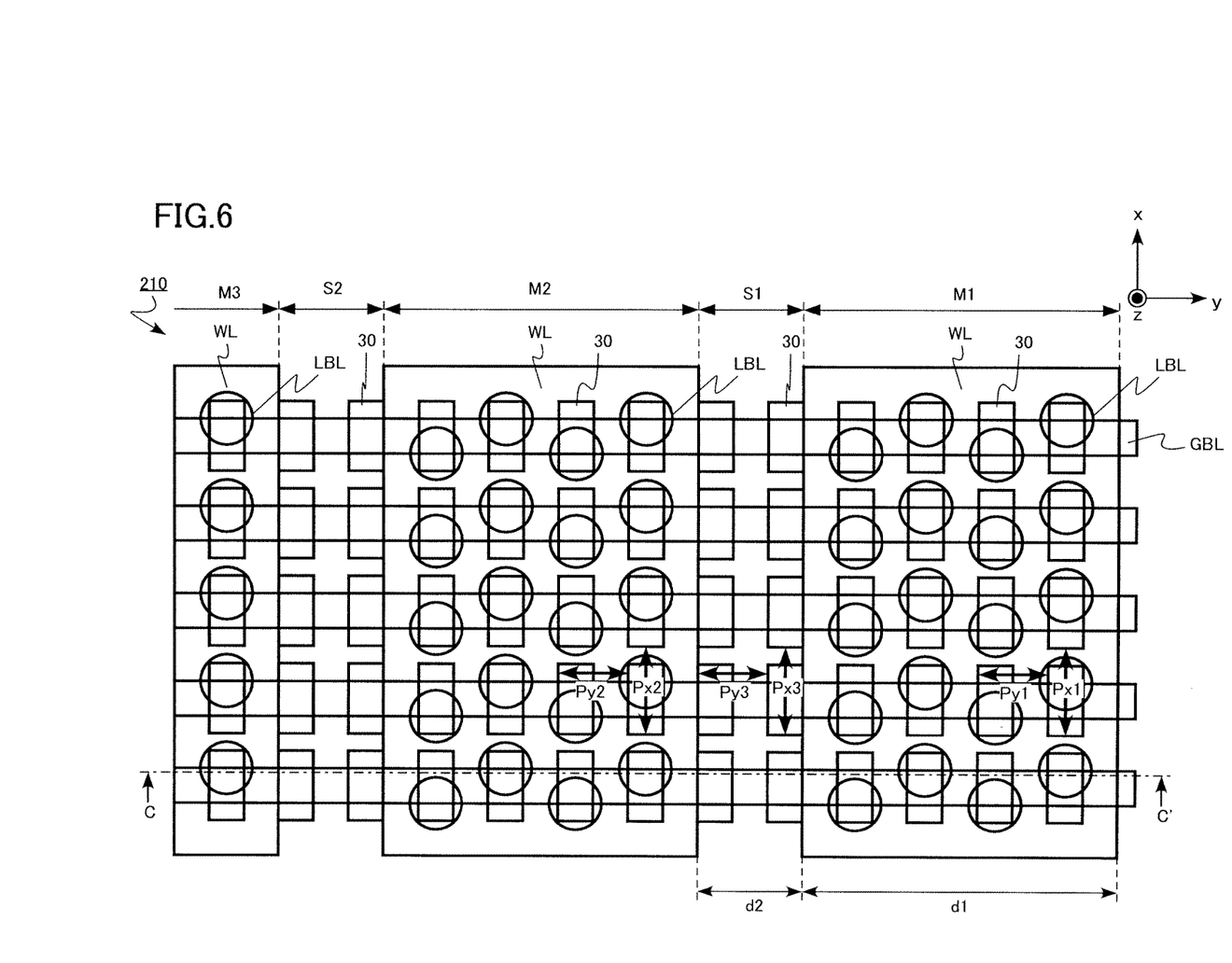
FIG. 6 is a top view schematically illustrating a memory cell array of a memory device according to a second embodiment.
Figure 7:
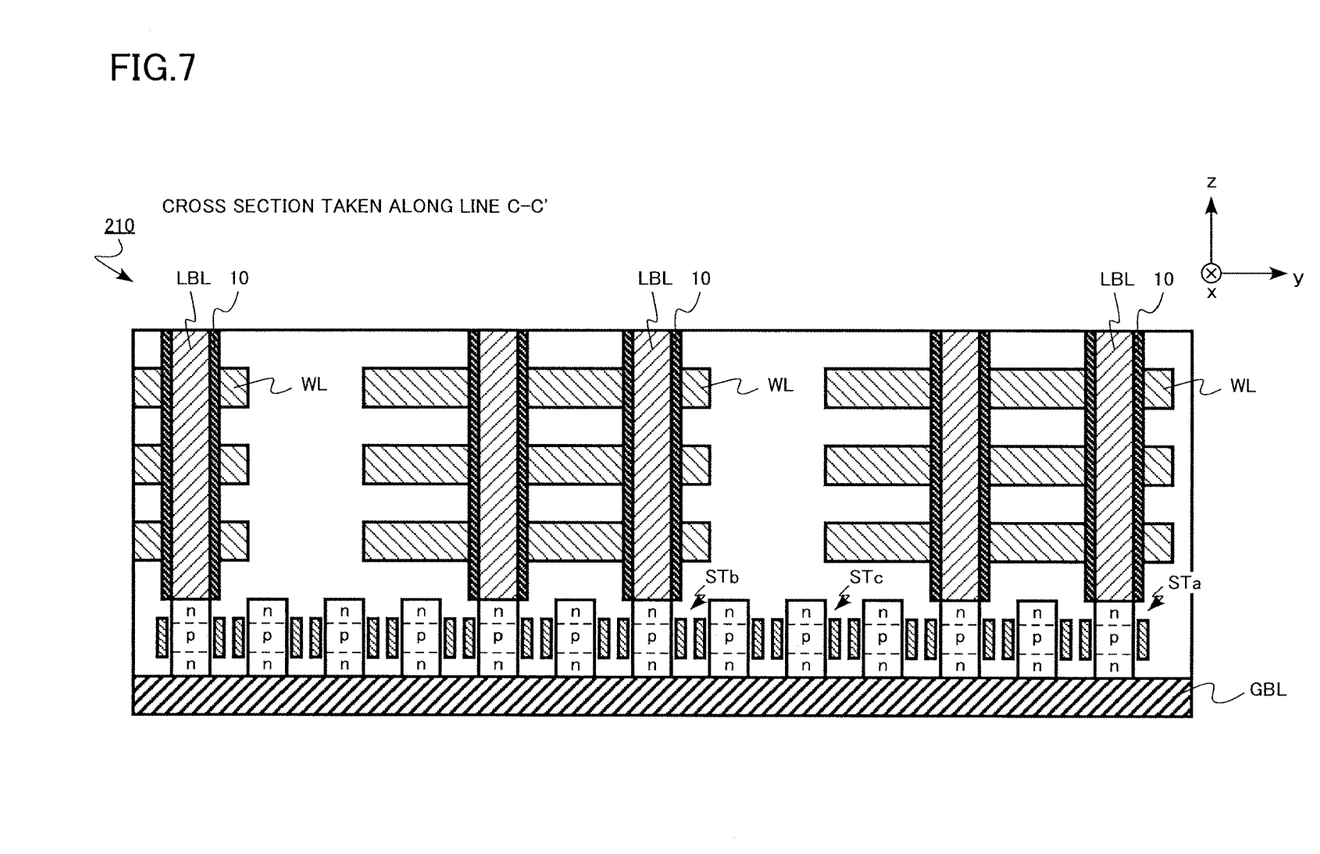
FIG. 7 is a cross-sectional view schematically illustrating the memory cell array of the memory device according to the second embodiment.

FIG. 6 is a top view schematically illustrating a memory cell array 210 of the memory device according to the second embodiment. FIG. 7 is a cross-sectional view schematically illustrating the memory cell array 210 of the memory device according to the second embodiment. FIG. 7 corresponds to the cross section taken along the line C-C' of FIG. 6.

The memory cell array 210 includes a plurality of word lines WL, a plurality of global bit lines GBL (main bit lines), a plurality of local bit lines LBL (sub-bit lines), a plurality of select transistors ST (transistors), a resistance-change layer 10, and an interlayer insulating layer 20. The select transistor ST includes a semiconductor layer 30, a gate electrode 32, and a gate insulating film (not illustrated). The memory cell array 210 includes a first memory region M1, a second memory region M2, a third memory region M3, a first space region S1, and a second space region S2.

Hereinafter, a plurality of word lines WL in the first memory region M1 are generically referred to as a first word line group and a plurality of local bit lines LBL in the first memory region M1 are generically referred to as a first local bit line group (first sub-bit line group). In addition, a plurality of word lines WL in the second memory region M2 are generically referred to as a second word line group and a plurality of local bit lines LBL in the second memory region M2 are generically referred to as a second local bit line group (second sub-bit line group).

Among the select transistors ST, a plurality of select transistors STa in the first memory region M1 are generically referred to as a first transistor group. Among the select transistors ST, a plurality of select transistors STb in the second memory region M2 are generically referred to as a second transistor group. Among the select transistors ST, a plurality of select transistors STc in the first space region S1 are generically referred to as a third transistor group. The third transistor group is located between the first transistor group and the second transistor group.

FIG. 6 illustrates the arrangement of the semiconductor layers 30 of the plurality of word lines WL, the plurality of global bit lines GBL (main bit lines), the plurality of local bit lines LBL (sub-bit lines), and the plurality of select transistors ST (transistors) in the memory cell array 210.

The plurality of select transistors STa included in the first transistor group are electrically connected to the plurality of local bit lines LBL of the first local bit line group. The plurality of select transistors STb included in the second transistor group are electrically connected to the plurality of local bit lines LBL of the second local bit line group.

The plurality of select transistors STc included in the third transistor group are not connected to the plurality of local bit lines LBL of the first local bit line group and the plurality of local bit lines LBL of the second local bit line group. The plurality of select transistors STc included in the third transistor group do not operate as transistors. The plurality of select transistors STc included in the third transistor group are dummy select transistors ST.

The plurality of select transistors ST included in the first transistor group, the second transistor group, and the third transistor group have the same arrangement pitch in the x direction (first direction) and the y direction (second direction). That is, the arrangement pitch (Px1 in FIG. 6) between the select transistors ST of the first transistor group in the x direction, the arrangement pitch (Px2 in FIG. 6) between the select transistors ST of the second transistor group in the x direction, and the arrangement pitch (Px3 in FIG. 6) between the select transistors ST of the third transistor group in the x direction are equal to each other. In other words, Px1=Px2=Px3 is established. In addition, the arrangement pitch (Py1 in FIG. 6) between the select transistors ST of the first transistor group in the y direction, the arrangement pitch (Py2 in FIG. 6) between the select transistors ST of the second transistor group in the y direction, and the arrangement pitch (Py3 in FIG. 6) between the select transistors ST of the third transistor group in the y direction are equal to each other. That is, Py1=Py2=Py3 is established.

The sum (d1+d2) of the width (d1 in FIG. 6) of the plurality of word lines WL of the first word line group in the y direction (second direction) and the distance (d2 in FIG. 6) between the plurality of word lines WL of the first word line group and the plurality of word lines WL of the second word line group is an integer multiple of the arrangement pitch (Py1 in FIG. 6) between the select transistors ST of the first transistor group in the y direction (second direction). That is, the select transistors ST are arranged at a constant pitch in the y direction in the memory cell array 210.

For example, in a case in which a film is patterned by lithography or dry etching, when an uneven pattern is formed, there is a concern that the shape of the processed film will be non-uniform. For example, there is a concern that the taper angle of the side surface of the processed film, the width of the processed film, or the gap between the patterns of the processed film will be non-uniform.

According to the second embodiment, the select transistors ST are also provided in the first space region S1 and the second space region S2 in which the memory cell MC is not formed. With this configuration, for example, when the semiconductor layer 30 or the gate electrode 32 of the select transistor ST is patterned, unevenness in the shape of the pattern depending on the density of the pattern is less likely to occur. Therefore, the characteristics of the select transistor ST are stabilized. As a result, a resistance-change memory with stable characteristics is achieved.

As described above, according to the memory device of the second embodiment, similarly to the first embodiment, it is possible to improve the degree of integration of the resistance-change memory. In addition, similarly to the first embodiment, it is possible to improve the operating speed of the resistance-change memory. Further, it is possible to stabilize the operation characteristics of the resistance-change memory.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
   a first word line group including a plurality of word lines, the plurality of word lines having a flat plate shape parallel to a first direction and a second direction perpendicular to the first direction, the plurality of word lines being stacked in a third direction perpendicular to the first direction and the second direction;
   a plurality of main bit lines including a first main bit line, the plurality of main bit lines extending in the second direction;
   a plurality of transistors including a first transistor and a second transistor, a channel width of the first transistor and the second transistor in the first direction being greater than a width of the plurality of main bit lines in the first direction, at least some of the plurality of transistors being provided between the plurality of word lines of the first word line group and the plurality of main bit lines;
   a first sub-bit line group including a plurality of sub-bit lines, the plurality of sub-bit lines of the first sub-bit line group including a first sub-bit line and a second sub-bit line adjacent to the first sub-bit line, the first sub-bit line being electrically connected to the first main bit line with the first transistor interposed therebetween, the second sub-bit line being electrically connected to the first main bit line with the second transistor interposed therebetween, a line segment virtually connecting the first sub-bit line and the second sub-bit line intersecting the second direction, the plurality of sub-bit lines of the first sub-bit line group extending in the third direction, the plurality of sub-bit lines of the first sub-bit line group intersecting the plurality of word lines of the first word line group, each of the plurality of sub-bit lines of the first sub-bit line group being electrically connected to one of the plurality of main bit lines with one of the plurality of transistors interposed therebetween; and a resistance-change layer provided between each of the plurality of word lines of the first word line group and each of the plurality of sub-bit lines of the first sub-bit line group.

2. The memory device according to claim 1, wherein the channel width in the first direction is equal to or greater than 1.2 times the width of the plurality of main bit lines in the first direction.

3. The memory device according to claim 1, wherein an angle formed between the line segment and the second direction is equal to or greater than 15 degrees.

4. The memory device according to claim 1, further comprising:
a second word line group separated from the first word line group in the second direction, the second word line group including a plurality of word lines, the plurality of word lines of the second word line group having a flat plate shape parallel to the first direction and the second direction, the plurality of word lines of the second word line group being stacked in the third direction; and
a second sub-bit line group including a plurality of sub-bit lines, the plurality of sub-bit lines of the second sub-bit line group extending in the third direction, the plurality of sub-bit lines of the second sub-bit line group intersecting the plurality of word lines of the second word line group, each of the plurality of sub-bit lines of the second sub-bit line group being electrically connected to one of the plurality of main bit lines with one of the plurality of transistors interposed therebetween;
wherein the plurality of transistors include a first transistor group, a second transistor group, and a third transistor group located between the first transistor group and the second transistor group,
a plurality of transistors included in the first transistor group are electrically connected to the plurality of sub-bit lines of the first sub-bit line group,
a plurality of transistors included in the second transistor group are electrically connected to the plurality of sub-bit lines of the second sub-bit line group,
a plurality of transistors included in the third transistor group are not connected to the plurality of sub-bit lines of the first sub-bit line group and the plurality of sub-bit lines of the second sub-bit line group,
a plurality of transistors included in the first transistor group, the second transistor group, and the third transistor group have the same arrangement pitch in the first direction, and
the plurality of transistors included in the first transistor group, the second transistor group, and the third transistor group have the same arrangement pitch in the second direction.

5. The memory device according to claim 4, wherein a sum of a width of the plurality of word lines of the first word line group in the second direction and a distance between the plurality of word lines of the first word line group and the plurality of word lines of the second word line group is an integer multiple of the arrangement pitch in the second direction of the plurality of transistors included in the first transistor group.

6. The memory device according to claim 1, wherein the plurality of main bit lines include a second main bit line adjacent to the first main bit line in the first direction, the second main bit line extends in the second direction, and
a width of the first main bit line in the first direction is less than a distance between the first main bit line and the second main bit line.

7. The memory device according to claim 1, wherein the plurality of main bit lines include a second main bit line adjacent to the first main bit line in the first direction, the second main bit line extends in the second direction, and
a distance between the first sub-bit line and the second main bit line is less than a distance between the second sub-bit line and the second main bit line.

8. The memory device according to claim 1, wherein the plurality of sub-bit lines electrically connected to the first main bit line are arranged in zigzag.

9. The memory device according to claim 1, wherein each of the plurality of transistors includes a semiconductor layer, a gate electrode, and a gate insulating layer provided between the semiconductor layer and the gate electrode.

10. The memory device according to claim 9, wherein the semiconductor layer is made of polysilicon.

11. A memory device comprising:
a plurality of word lines having a flat plate shape parallel to a first direction and a second direction perpendicular to the first direction, the plurality of word lines being stacked in a third direction perpendicular to the first direction and the second direction;
a first main bit line extending in the second direction;
a second main bit line adjacent to the first main bit line in the first direction, the second main bit line extending in the second direction;
a second sub-bit line extending in the third direction, the second sub-bit line being electrically connected to the first main bit line;
a third sub-bit line extending in the third direction, the third sub-bit line being adjacent to the second sub-bit line in the first direction, the third sub-bit line being electrically connected to the second main bit line;
a first sub-bit line extending in the third direction, the first sub-bit line being located between the second sub-bit line and the third sub-bit line in the first direction, the first sub-bit line being provided at a position different from the position of the second sub-bit line and the third sub-bit line in the second direction, the first sub-bit line being electrically connected to the first main bit line;
a first transistor provided between the first main bit line and the first sub-bit line, a channel width of the first transistor in the first direction being greater than a width of the first main bit line in the first direction;
a second transistor provided between the first main bit line and the second sub-bit line, a channel width of the second transistor in the first direction being greater than the width of the first main bit line in the first direction;
a third transistor provided between the second main bit line and the third sub-bit line, a channel width of the third transistor in the first direction being greater than a width of the second main bit line in the first direction;
a first resistance-change layer provided between one of the plurality of word lines and the first sub-bit line;
a second resistance-change layer provided between the one of the plurality of word lines and the second sub-bit line; and a third resistance-change layer provided between the one of the plurality of word lines and the third sub-bit line.

12. The memory device according to claim 11, wherein the channel width of the first transistor in the first direction is equal to or greater than 1.2 times the width of the first main bit lines in the first direction.

13. The memory device according to claim 11, wherein the width of the first main bit line in the first direction is less than a distance between the first main bit line and the second main bit line.

14. The memory device according to claim 11, wherein each of the first transistor, the second transistor, and the third transistor includes a semiconductor layer, a gate electrode, and a gate insulating layer provided between the semiconductor layer and the gate electrode.

15. The memory device according to claim 14, wherein the semiconductor layer is made of polysilicon.

\* \* \* \* \*